United States Patent
Hsu et al.

(10) Patent No.: US 7,585,150 B2
(45) Date of Patent: Sep. 8, 2009

(54) COMPOSITE FAN AND FRAME THEREOF

(75) Inventors: Shuo-Shiu Hsu, Taoyuan Hsien (TW); Shun-Chen Chang, Taoyuan Hsien (TW); Wen-Shi Huang, Taoyuan Hsien (TW); Li-Chen Lin, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 215 days.

(21) Appl. No.: 11/370,908

(22) Filed: Mar. 9, 2006

(65) Prior Publication Data

US 2007/0003413 A1    Jan. 4, 2007

(30) Foreign Application Priority Data

Jun. 30, 2005    (TW) ................ 94122140 A (51) Int. Cl.
*F04D 29/52*    (2006.01)
(52) U.S. Cl. ................ 415/213.1; 415/214.1; 415/220; 415/66; 416/198 R
(58) Field of Classification Search .............. 415/213.1, 415/214.1, 220; 416/189, 198 R; 403/331, 403/335, 363, 381, 375; 285/325
See application file for complete search history.

(56) References Cited

U.S. PATENT DOCUMENTS

| 942,047 | A | * | 12/1909 | Atkinson | 285/325 |
| 3,223,132 | A | * | 12/1965 | Erne | 144/87 |
| D231,789 | S | * | 6/1974 | Ozeki et al. | D25/153 |
| 6,530,746 | B2 | * | 3/2003 | Huang et al. | 415/213.1 |
| 6,827,549 | B1 | * | 12/2004 | Horng et al. | 415/68 |
| 7,156,611 | B2 | * | 1/2007 | Oosawa et al. | 415/68 |
| 7,168,912 | B2 | * | 1/2007 | Sun | 415/66 |

* cited by examiner

*Primary Examiner*—Ninh H Nguyen
(74) *Attorney, Agent, or Firm*—Birch, Stewart, Kolasch & Birch, LLP (57) ABSTRACT

A composite fan frame includes a first frame and a second frame. The first frame has a first surface formed with at least one first protrusion portion. The second frame has a second surface formed with at least one first recess portion. When the first surface touches the second surface, the first protrusion portion is inserted into the first recess portion along a predetermined sliding direction such that the first frame and the second frame are combined. Also, a composite fan having the composite fan frame is disclosed.

20 Claims, 12 Drawing Sheets

COMPOSITE FAN AND FRAME THEREOF

This Non-provisional application claims priority under U.S.C.§ 119(a) on Patent Application No(s). 094122140, filed in Taiwan, Republic of China on Jun. 30, 2005, the entire contents of which are hereby incorporated by reference.

BACKGROUND OF THE INVENTION

1. Field of Invention

The invention relates to a fan and a fan frame thereof, and in particular to a composite fan and a fan frame thereof.

2. Related Art

With the progress of the technology, the efficiency of the electronic product is gradually enhanced. However, the electronic product generates heat as it operates. The heat tends to reduce the stability and the efficiency of the electronic product if the heat is not properly dissipated, or may even burn out the electronic product. Thus, most electronic products use fans to make the electronic products operate within a predetermined operating temperature range. However, a single fan sometimes cannot provide sufficient airflow. So, two or more than two fans are assembled so that the sufficient airflow can be provided.

Figure 1:
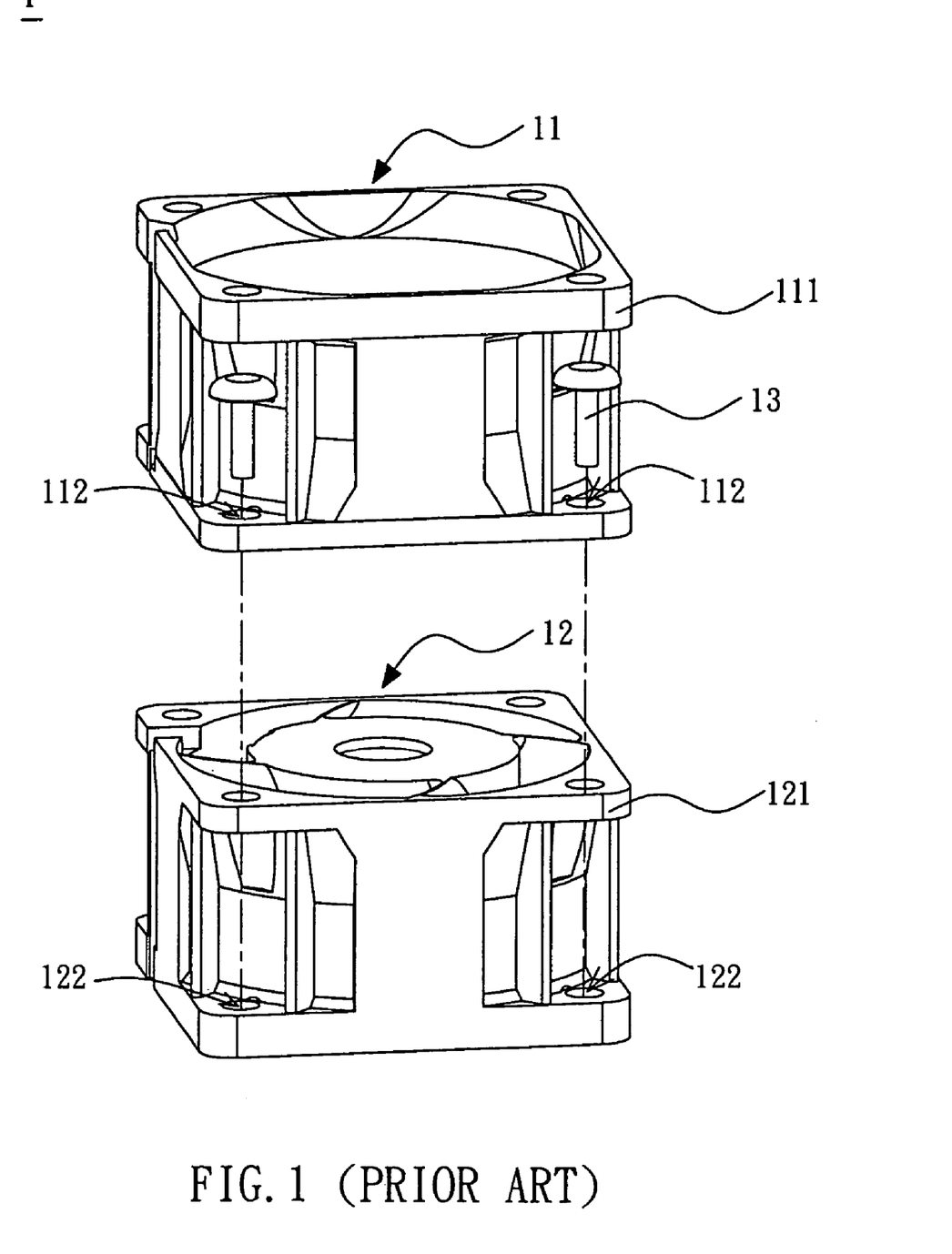
FIG. 1 is a schematic view showing a conventional composite fan before being assembled.
Figure 2:
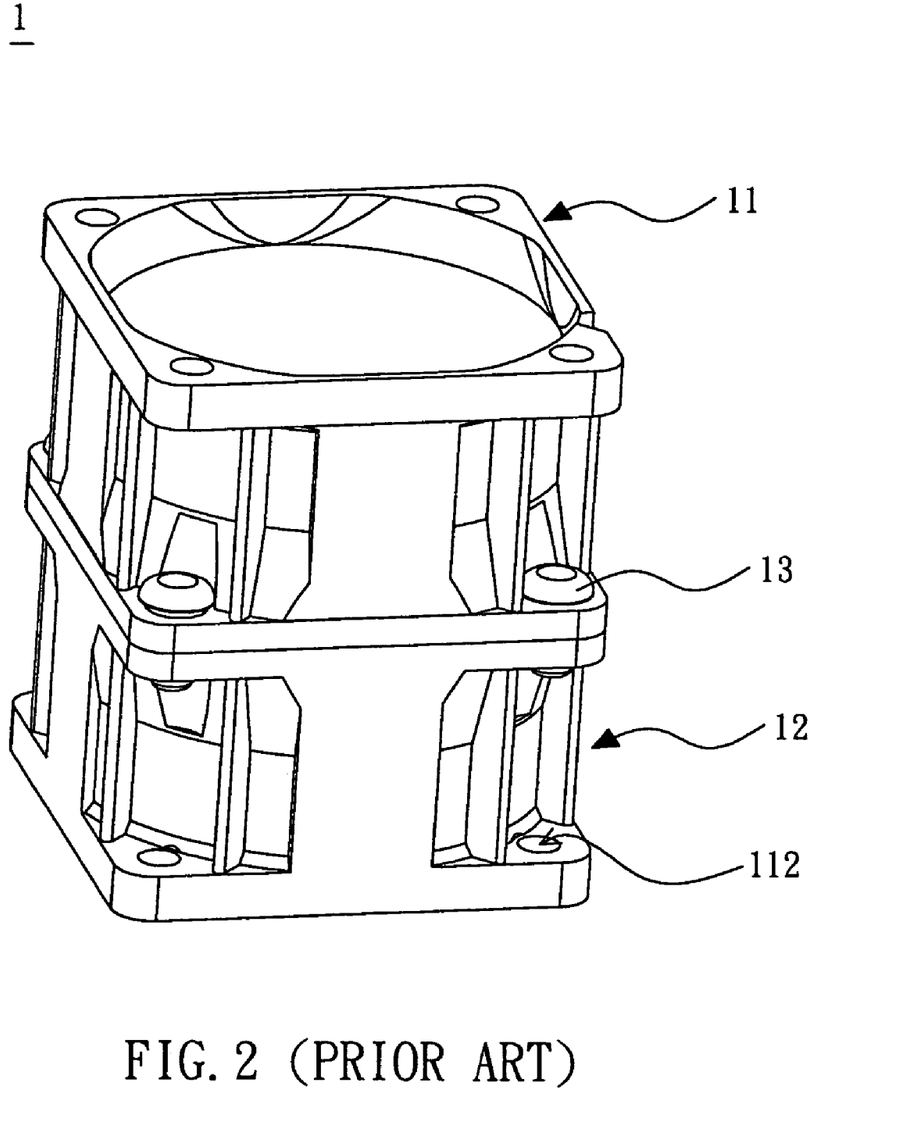
FIG. 2 is a schematic view showing the conventional composite fan after being assembled.

FIGS. 1 and 2 are schematic views respectively showing a conventional composite fan before and after being assembled. The conventional composite fan 1 includes two fans 11 and 12, each of which is an individual fan. Several holes 112 and 122 are respectively formed around frames 11 and 121 of the fans 11 and 12 such that a user can assemble the two fans 11 and 12 to form the conventional composite fan 1 by using multiple screws 13.

However, the conventional composite fan 1 needs a lot of screws 13 to combine the two fans 11 and 12. As the results, it increases the production cost. Furthermore, the screw 13 is usually thin and small and tends to be lost so that a tool has to be used during the processes of assembling of the fans. Thus, the fans cannot be easily assembled. In addition, in order to facilitate the processes of assembling, the frames 111 and 121 of the composite fan 1 are designed to correspond to the screws 13 such that the frames 111 and 121 are relatively thinner to allow the screws 13 to be easily inserted into the holes 112 and 122. Thus, the structures of the frames 111 and 121 are weaker.

In general, if multiple fans are to be assembled to a system, it is necessary to use multiple screws to pass through multiple holes of each fan so as to fasten each fan to a system wall. As the results, the assembling processes are complicated and inconvenient. Thus, it is an extremely effective and simple assembling method to use multiple long screws, which can pass through the holes of the two fans and thus fasten the two fans to the system wall. However, because the conventional method of assembling the two fans into the composite fan 1 is to respectively screw the screws 13 to the holes 112 and 122 of the frames 111 and 121, the user cannot pass the long screws through the holes of the frames 111 and 121. Therefore, using multiple long screws can not be performed in the conventional composite fan 1.

Therefore, it is an important subject of the invention to provide a fan and a frame thereof capable of enhancing the assembling convenience and obtaining the better structure intensity without using extra screws.

SUMMARY OF THE INVENTION

In view of the foregoing, the invention is to provide a composite fan and a fan frame thereof capable of enhancing the assembling convenience and obtaining the better structure intensity without using extra screws.

To achieve the above, a composite fan frame of the invention includes a first frame and a second frame. The first frame has a first surface formed with at least one first protrusion portion. The second frame has a second surface formed with at least one first recess portion. When the first surface touches the second surface, the first protrusion portion is inserted into the first recess portion along a predetermined sliding direction such that the first frame and the second frame are combined.

To achieve the above, a composite fan of the invention includes a first fan and a second fan. The first fan has a first frame and a first impeller, and the first frame has a first surface and a first cavity. The first impeller is disposed in the first cavity, and the first surface has at least one first protrusion portion. The second fan has a second frame and a second impeller, and the second frame has a second surface and a second cavity. The second impeller is disposed in the second cavity, and the second surface has at least one first recess portion. When the first surface touches the second surface, the first protrusion portion is inserted into the first recess portion along a predetermined sliding direction such that the first fan and the second fan are combined.

As mentioned hereinabove, the composite fan and the frame thereof according to the invention have the first protrusion portion and the first recess portion such that the first frame and the second frame may be easily assembled. Compared to the prior art, the fan and the frame thereof according to the invention have the advantages of being assembled easily without using screws and of having the better structure intensity.

The above objectives and advantages of the present invention will become more readily apparent to those ordinarily skilled in the art after reviewing the following detailed description and accompanying drawings, in which:

BRIEF DESCRIPTION OF THE DRAWINGS

The invention will become more fully understood from the detailed description given herein below view only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 3:
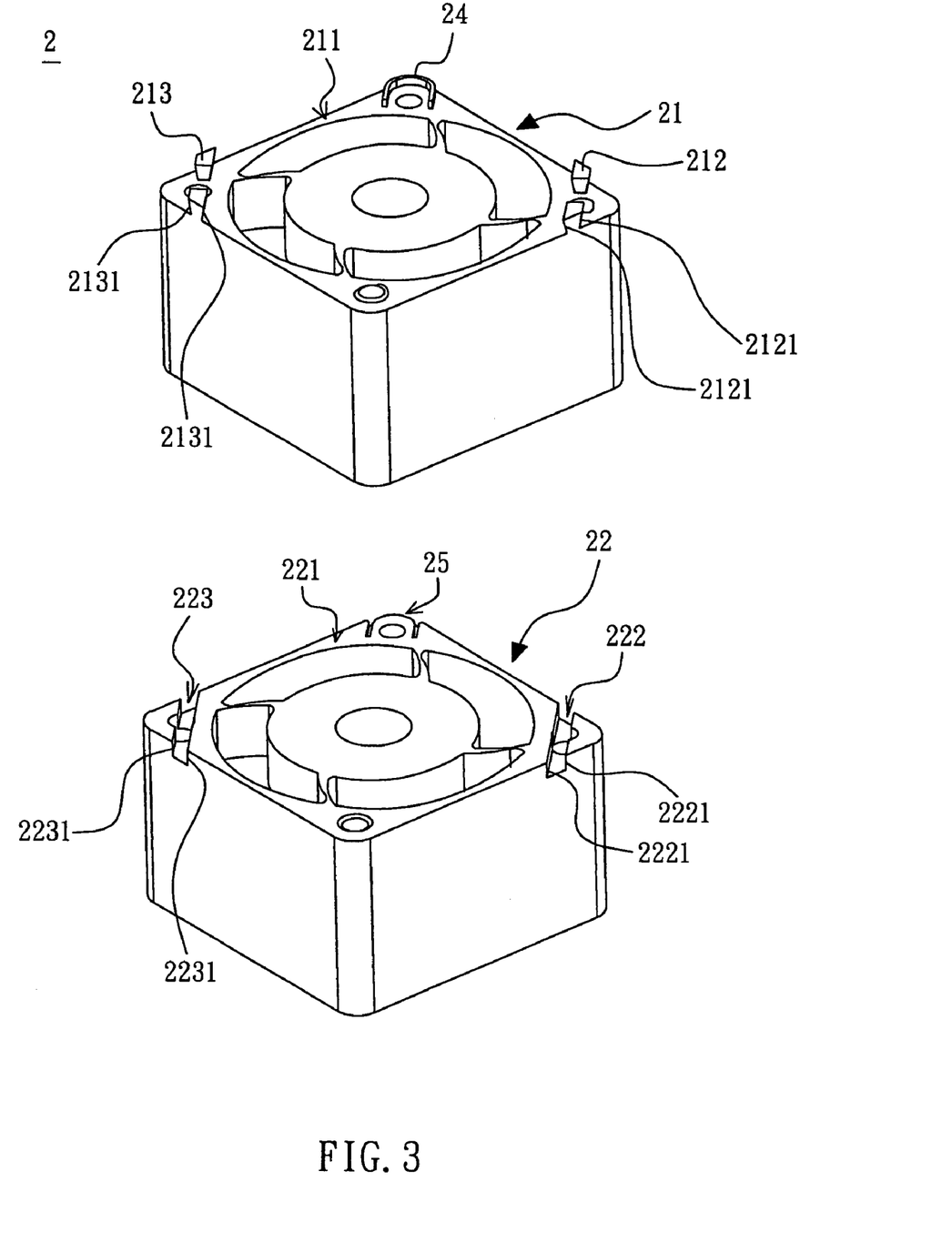
FIG. 3 is a schematic view showing a composite fan frame according to a first embodiment of the invention.

FIG. 3 is a schematic view showing a composite fan frame 2 according to a first embodiment of the invention. Referring to FIG. 3, the composite fan frame 2 includes a first frame 21 and a second frame 22.

The first frame 21 has preferably four lateral sides and a first surface 211, which is a bottom surface of the first frame 21. The first surface 211 has a first protrusion portion 212 and a second protrusion portion 213 which are disposed oppositely. Herein, the first surface 211 has a substantially tetragonal shape. The first protrusion portion 212 and the second protrusion portion 213 are respectively disposed at two opposite corners of the first surface 211. In this embodiment, the cross-section of each of the first protrusion portion 212 and the second protrusion portion 213 is a substantially inverse trapezoid. The first protrusion portion 212 and the second protrusion portion 213 respectively have first inclined surfaces 2121 and 2131.

The second frame 22 has four lateral sides and a second surface 221, i.e. the bottom surface of the second frame 22. The second surface 221 has a first recess portion 222 and a second recess portion 223 which are disposed oppositely. The second surface 221 has a substantially tetragonal shape. The first recess portion 222 and the second recess portion 223 are respectively disposed at two opposite corners of the second surface 221.

The cross-section of each of the first recess portion 222 and the second recess portion 223 is preferably a trapezoid. The first recess portion 222 and the second recess portion 223 respectively have second inclined surfaces 2221 and 2231. Thus, the size and shape of the first recess portion 222 are with respect to those of the first protrusion portion 212, and the size and shape of the second recess portion 223 are with respect to those of the second protrusion portion 213. One of the first frame 21 and the second frame 22 illustrated in FIG. 3 is inversed to assemble with the other one. Consequently, the first inclined surfaces 2121 and 2131 of the first protrusion portion 212 and the second protrusion portion 213 rest against the second inclined surfaces 2221 and 2231 of the first recess portion 222 and the second recess portion 223, respectively. As the results, the first frame 21 and the second frame 22 are combined together tightly.

Figure 4:
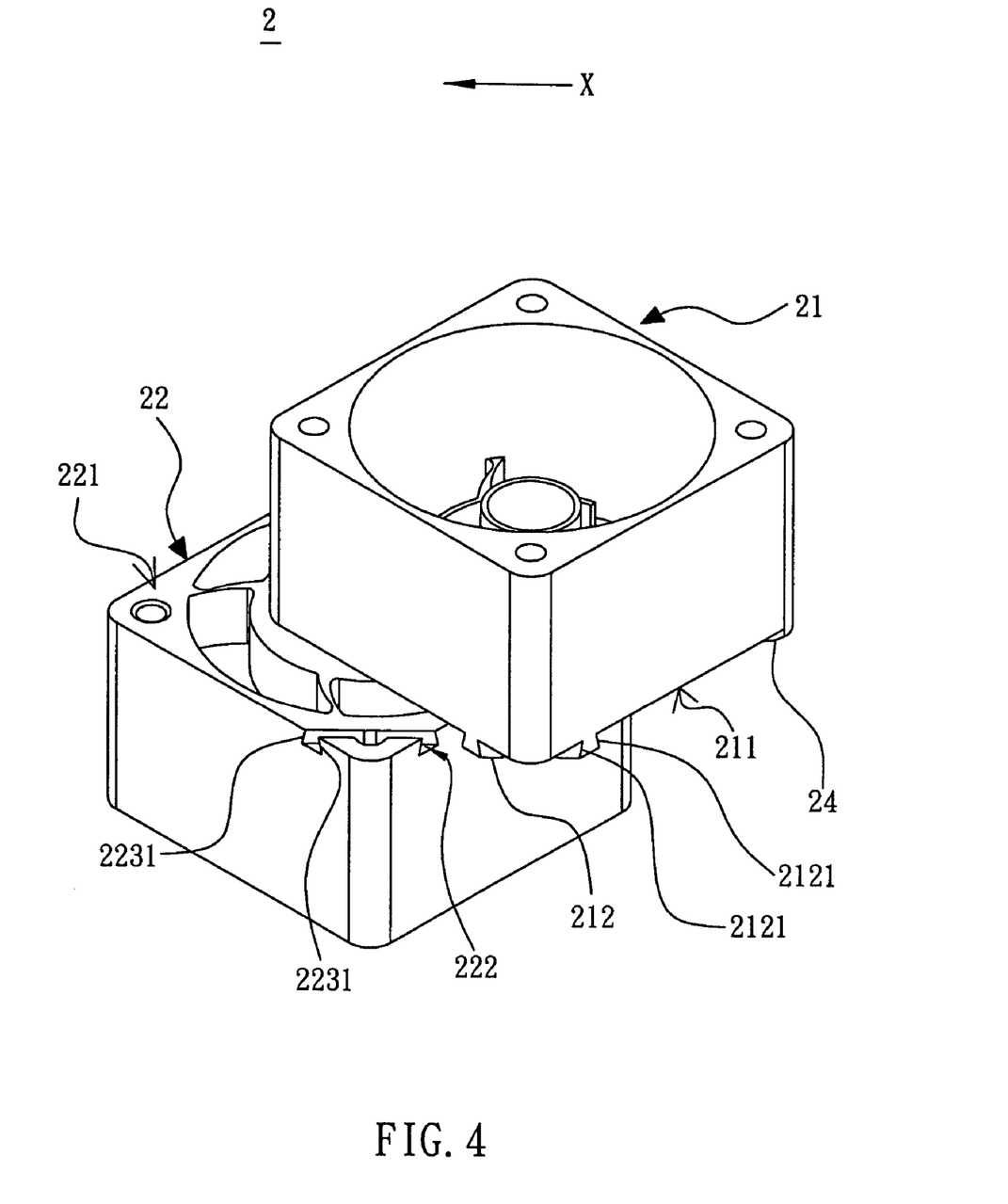
FIGS. 4 to 6 are schematic views showing operations of assembling the composite fan frame of FIG. 3.
Figure 5:
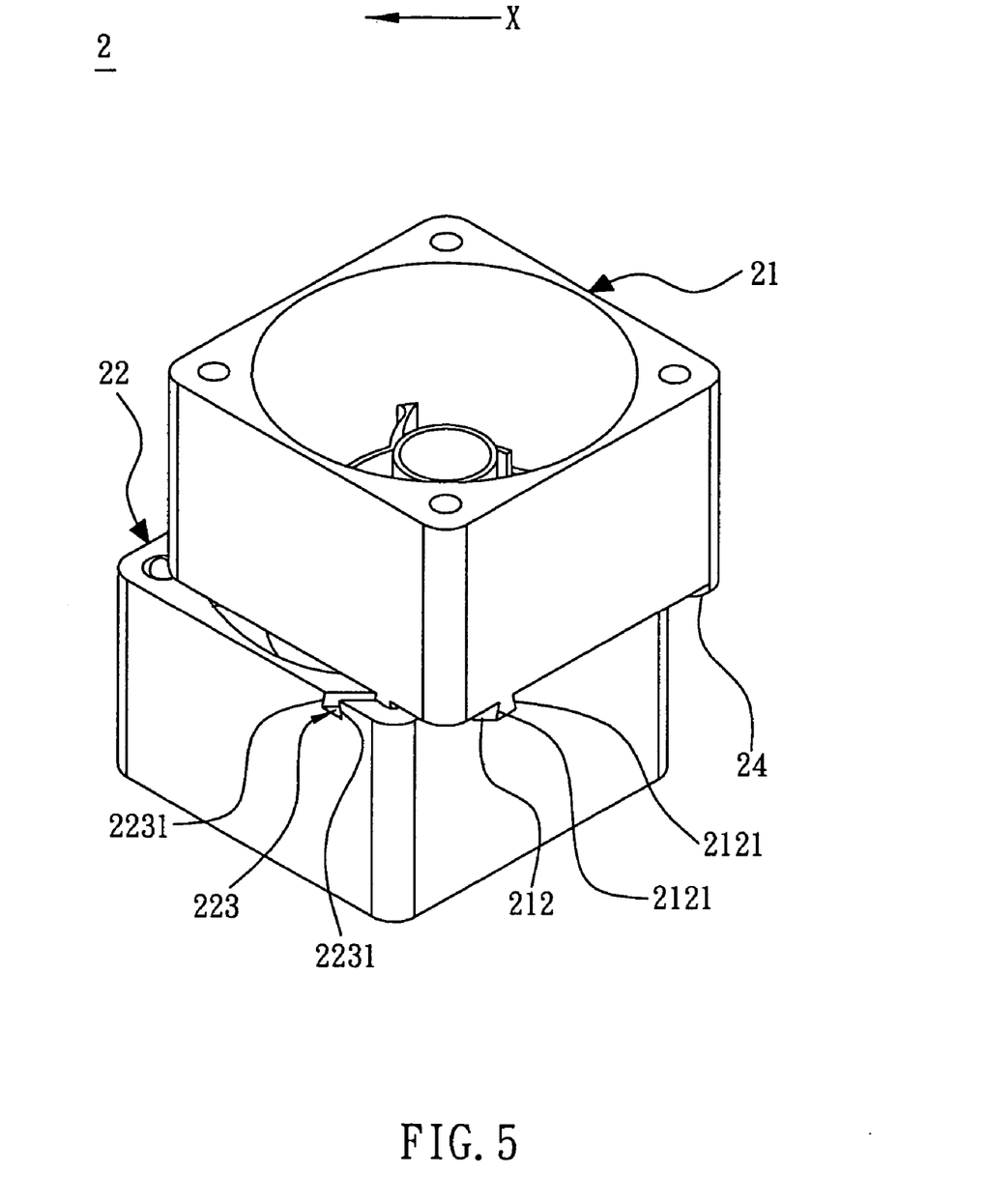
Figure 6:
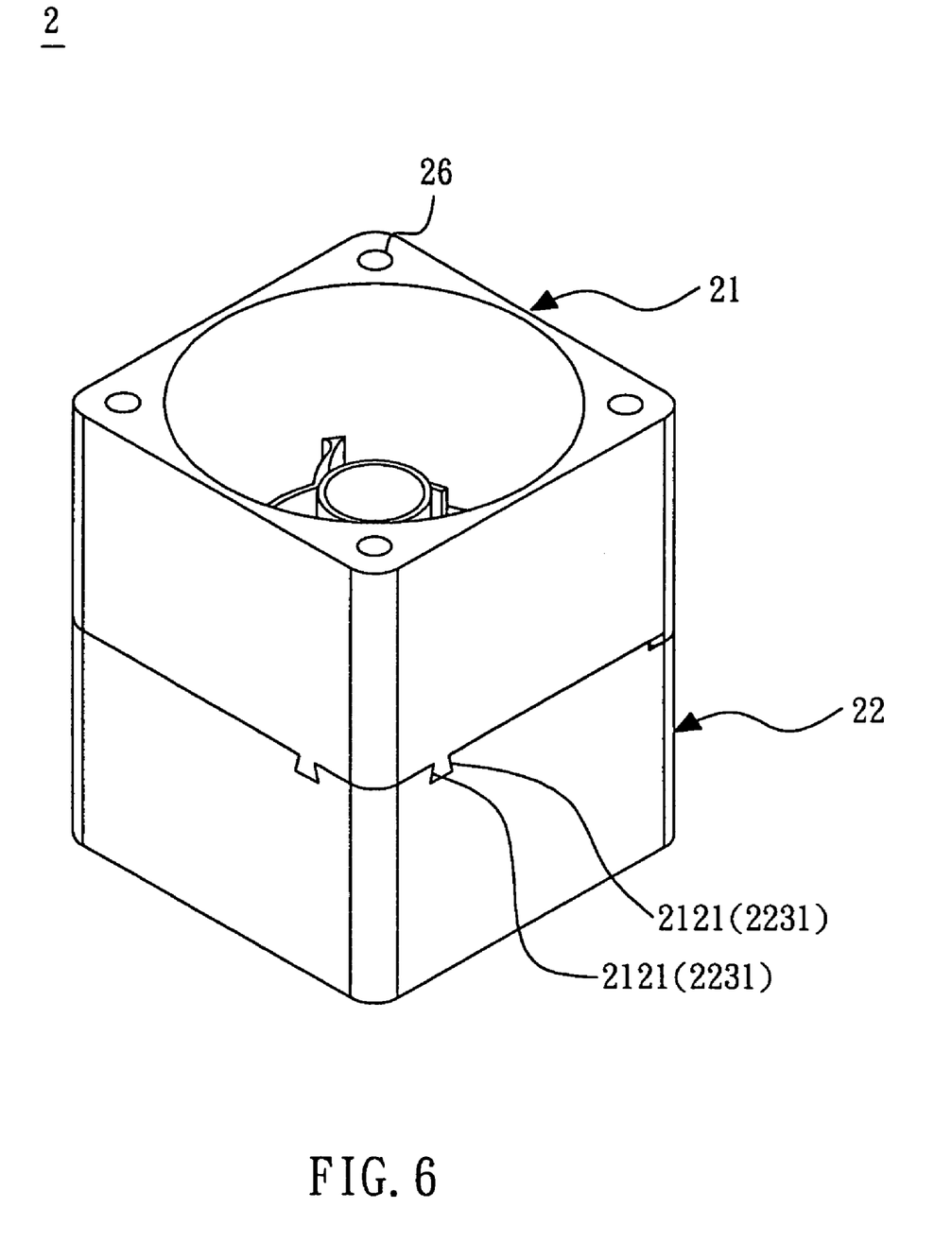

FIGS. 4 to 6 are schematic views showing operations of assembling the composite frame of FIG. 3. Referring to FIGS. 3 to 6, the method of assembling the composite fan frame 2 of this embodiment includes the following steps. First, the first frame 21 of FIG. 3 is disposed inversely so that the first surface 211 of the first frame 21 faces to and locates with respect to the second surface 221 of the second frame 22. Also, the first protrusion portion 212 and the second protrusion portion 213 of the first frame 21 are respectively with respect to the first recess portion 222 and the second recess portion 223 of the second frame 22, as shown in FIG. 4. In addition, the first frame 21 slides along a direction X so that the first protrusion portion 212 and the second protrusion portion 213 are inserted into the first recess portion 222 and the second recess portion 223, respectively, as shown in FIGS. 5 and 6. Consequently, the first inclined surfaces 2121 and 2131 of the first protrusion portion 212 and the second protrusion portion 213 rest against the second inclined surfaces 2221 and 2231 of the first recess portion 222 and the second recess portion 223 respectively such that the first frame 21 and the second frame 22 are combined.

It is noted that the sliding direction X of this embodiment is a straight-line direction according to the shapes of the first protrusion portion 212, the second protrusion portion 213, the first recess portion 222 and the second recess portion 223. However, the sliding direction X is not limited thereto. When the shapes of the first protrusion portion 212, the second protrusion portion 213, the first recess portion 222 and the second recess portion 223 have curved shapes, the sliding direction X can be a curved direction accordingly, and users can insert the first protrusion portion 212 and the second protrusion portion 213 into the first recess portion 222 and the second recess portion 223 by way of rotation such that the first frame 21 and the second frame 22 are combined.

In addition, the first protrusion portion 212 and the second protrusion portion 213 of this embodiment may be protrusion portions having elasticity and flexibility. Thus, when the first protrusion portion 212 and the second protrusion portion 213 are respectively inserted into the first recess portion 222 and the second recess portion 223, the first frame 21 and the second frame 22 may be combined firmly without using screws. Thus, the shapes of the first frame 21 and the second frame 22 need not to be changed in order to match with the screw 13, and the drawbacks of thinning the frames in order to make the screws be easily disposed in the prior art composite fan may be eliminated. Of course, the composite fan frame 2 of the invention may also have more than two frames.

Referring to FIGS. 3 and 4 again, the first frame 21 or the second frame 22 may further include a stopper 24 disposed on the first surface 211 or the second surface 221. The stopper 24 is preferably disposed on another corner of the tetragonal shape of the first frame 21 or the second frame 22 for controlling the relative movement of the first frame 21 and the second frame 22 so as to achieve the effect of positioning.

In this embodiment, the stopper 24 may have a U shape, a V shape or other shapes and is disposed on the first surface 211 of the first frame 21. In addition, a slot 25 having a shape matching with the stopper 24 is also correspondingly formed on the second surface 221 of the second frame 22. Thus, when the first protrusion portion 212 and the second protrusion portion 213 are respectively inserted into the first recess portion 222 and the second recess portion 223 along the sliding direction X, the first frame 21 and the second frame 22 may be positioned when the stopper 24 reaches to the slot 25. Thus, it is possible to prevent the user from further applying a force, which makes the first protrusion portion 212 and the second protrusion portion 213 to move beyond the first recess portion 222 and the second recess portion 223.

Second Embodiment

Figure 7:
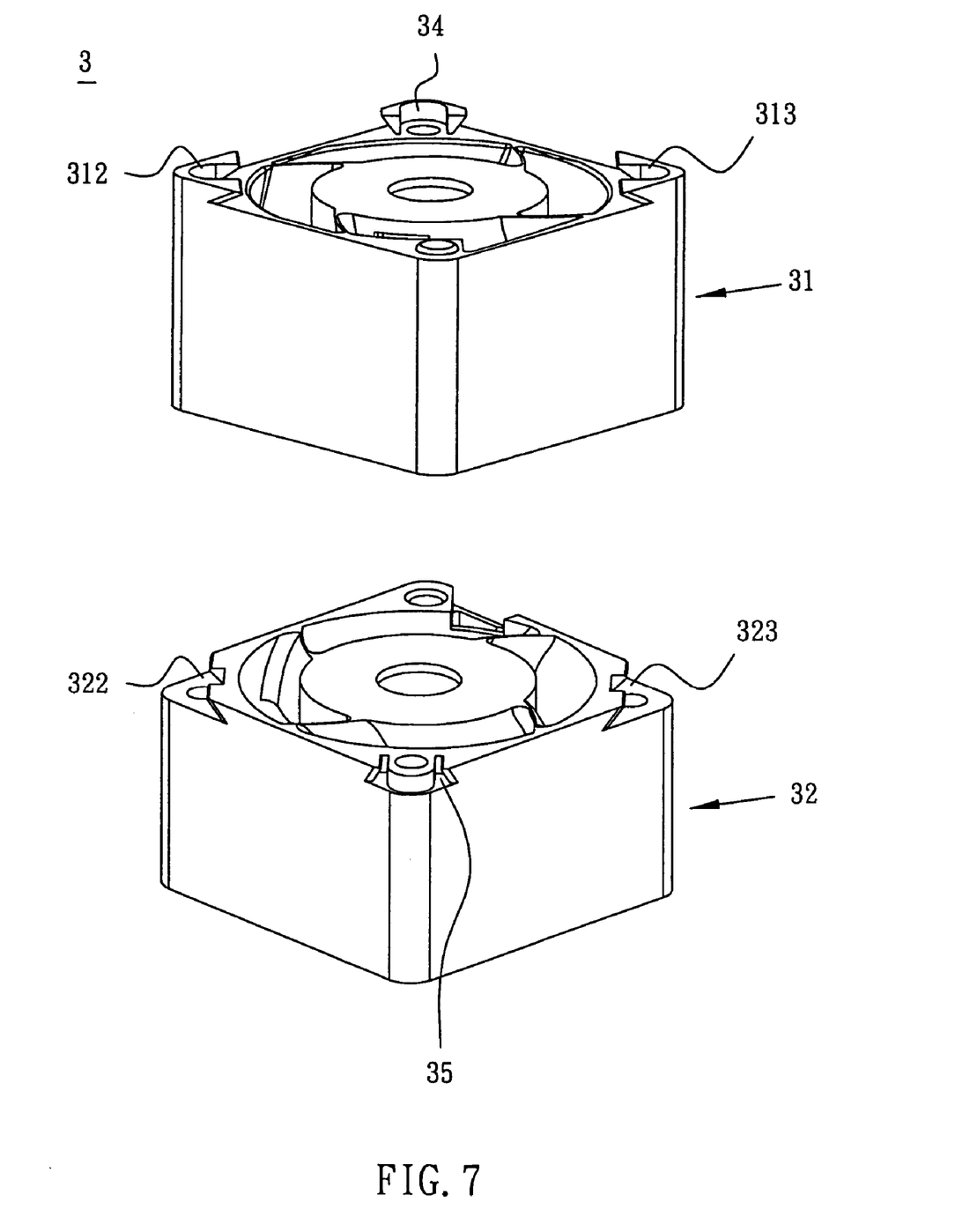
FIG. 7 is a schematic view showing a composite fan frame before being assembled according to a second embodiment of the invention.
Figure 8:
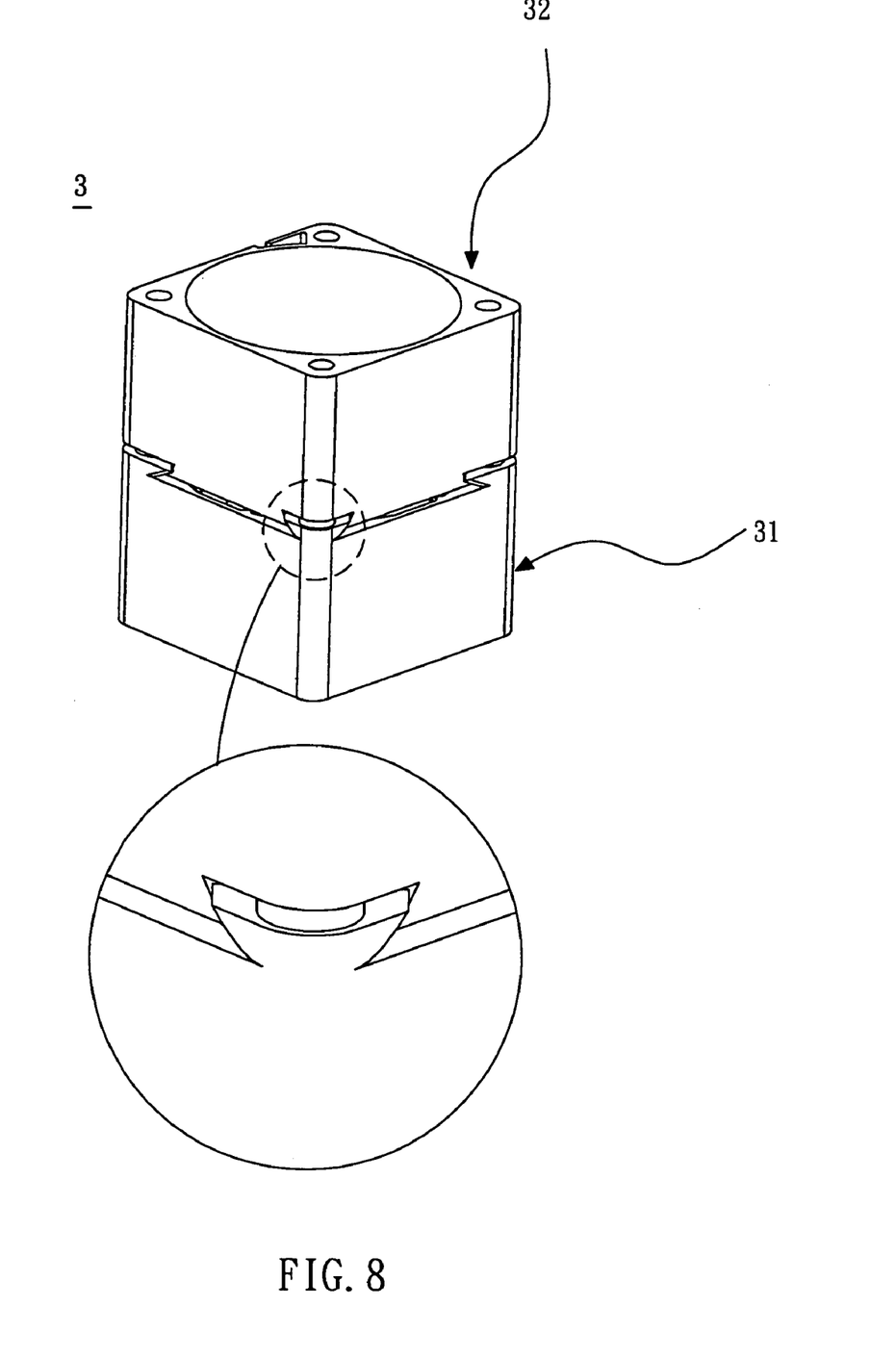
FIG. 8 is a schematic view showing the composite fan frame after being assembled according to the second embodiment of the invention.

FIGS. 7 and 8 are schematic views showing a composite fan frame 3 before and after being assembled according to a second embodiment of the invention. The composite fan frame 3 includes a first frame 31 and a second frame 32.

It is noted that the composite fan frame 3 of this embodiment is different from the composite fan frame 2 of the first embodiment (FIG. 3) because a first protrusion portion 312 and a second protrusion portion 313 of the first frame 31 have substantially triangular shapes, and are respectively disposed at two opposite corners of a surface of the first frame 31. The second frame 32 is formed with a first recess portion 322 and a second recess portion 323, which are disposed oppositely and with respect to the first protrusion portion 312 and the second protrusion portion 313 of the first frame 31. The first recess portion 322 and the second recess portion 323 are respectively disposed at two opposite corners of a surface of the second frame 32.

Figure 12:
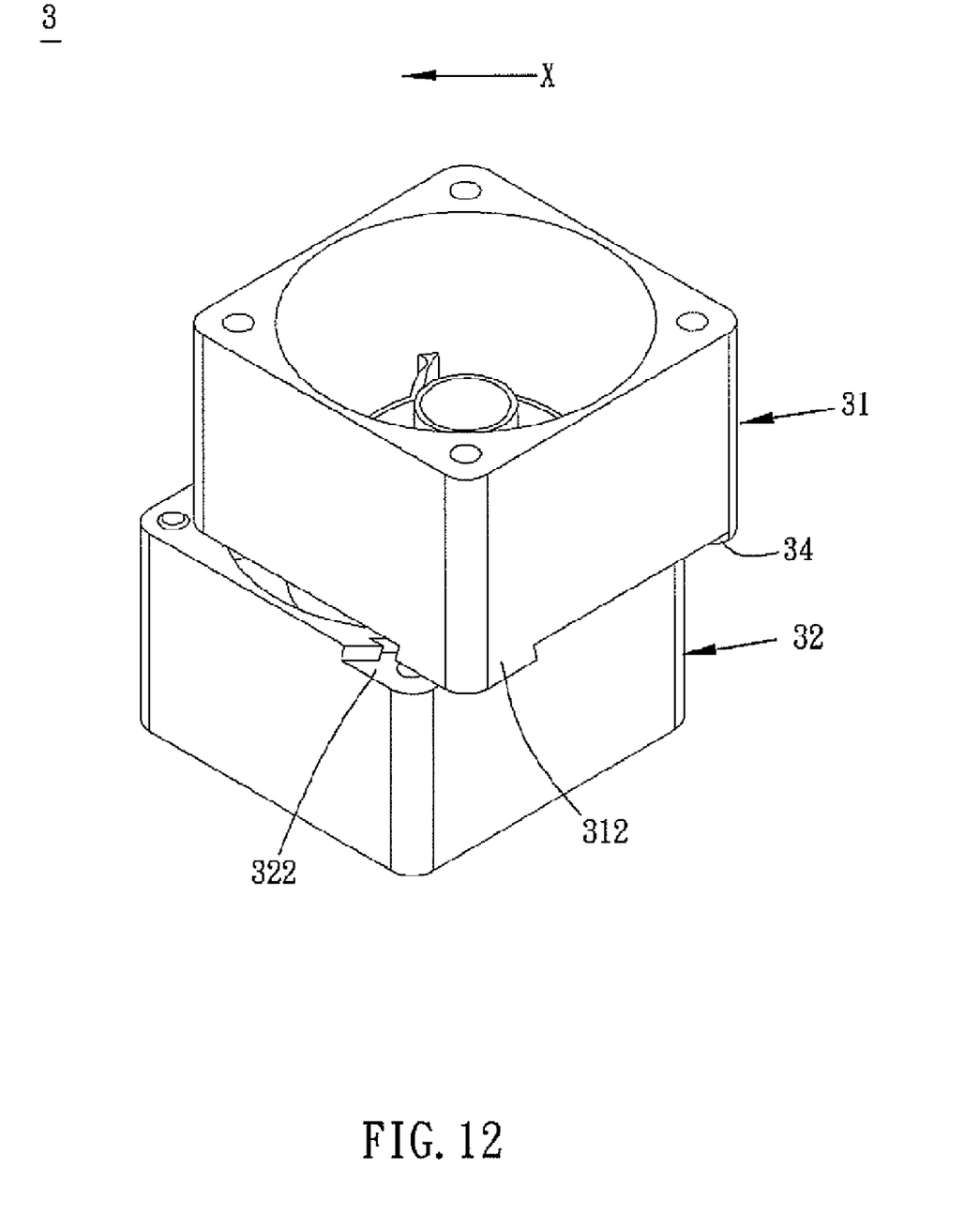
FIG. 12 is a schematic view showing the composite fan of FIG. 7 being assembled.

Similar to the first embodiment, the cross-section of each of the first protrusion portion 312 and the second protrusion portion 313 is configured to be an inverse trapezoid and each of the first protrusion portion 312 and the second protrusion portion 313 has an inclined surface for enhancing joint intensity. Correspondingly, the cross-section of each of the first recess portion 322 and the second recess portion 323 is preferably a trapezoid, and each of the first recess portion 322 and the second recess portion 323 has an inclined surface. Thus, the sizes and shapes of the first recess portion 322 and the second recess portion 323 of the second frame 32 match with those of the first protrusion portion 312 and the second protrusion portion 313 of the first frame 31. One of the first frame 31 and the second frame 32 illustrated in FIG. 7 is inversed to assemble with the other one illustrated in FIG. 12. As the results, the first protrusion portion 312 and the second protrusion portion 313 may be respectively inserted into the first recess portion 322 and the second recess portion 323 such that the first frame 31 and the second frame 32 are combined together as a unit.

In addition, the surface of the first frame 31 needn't to tightly contact the surface of the second frame 32. Instead, a space can be formed therebetween such that an air stream can flow in or out, whereby increasing the input or output air stream so that the property of the fan can be thus enhanced, as shown in FIG. 8.

Referring again to FIG. 7, the first frame 31 may further include a stopper 34 which may be disposed on a surface of the first frame 31 and is preferably disposed on another corner of the tetragonal shape of the first frame 31. The stopper 34 is for controlling the relative movement of the first frame 31 and the second frame 32 so as to achieve the effect of positioning. The stopper 34 may have a U shape, a V shape or other shapes. In this embodiment, the stopper 34, the first protrusion portion 312 and the second protrusion portion 313 have the same shape. Meanwhile, a slot 35 having a shape matching with the stopper 34 is also formed on the surface of the second frame 32. Thus, when the first protrusion portion 312 and the second protrusion portion 313 are respectively inserted into the first recess portion 322 and the second recess portion 323, the frames 31 and 32 may be positioned when the stopper 34 reaches to the slot 35. Thus, it is possible to prevent the user from further applying a force, which makes the first protrusion portion 312 and the second protrusion portion 313 to move beyond the first recess portion 322 and the second recess portion 323.

It is noted that the sizes and shapes of the first protrusion portion 312, the second protrusion portion 313, the first recess portion 322 and the second recess portion 323 of the composite fan frame 3 can be flexibly designed according to users' requirements. Also, the sizes and shapes of the first protrusion portion, the second protrusion portion, the first recess portion and the second recess portion are not limited to those of the above-mentioned aspects. For example, referring to FIG. 9, it is a schematic view showing the first protrusion portion, the second protrusion portion, the first recess portion and the second recess portion according to another aspect of the invention.

Figure 9:
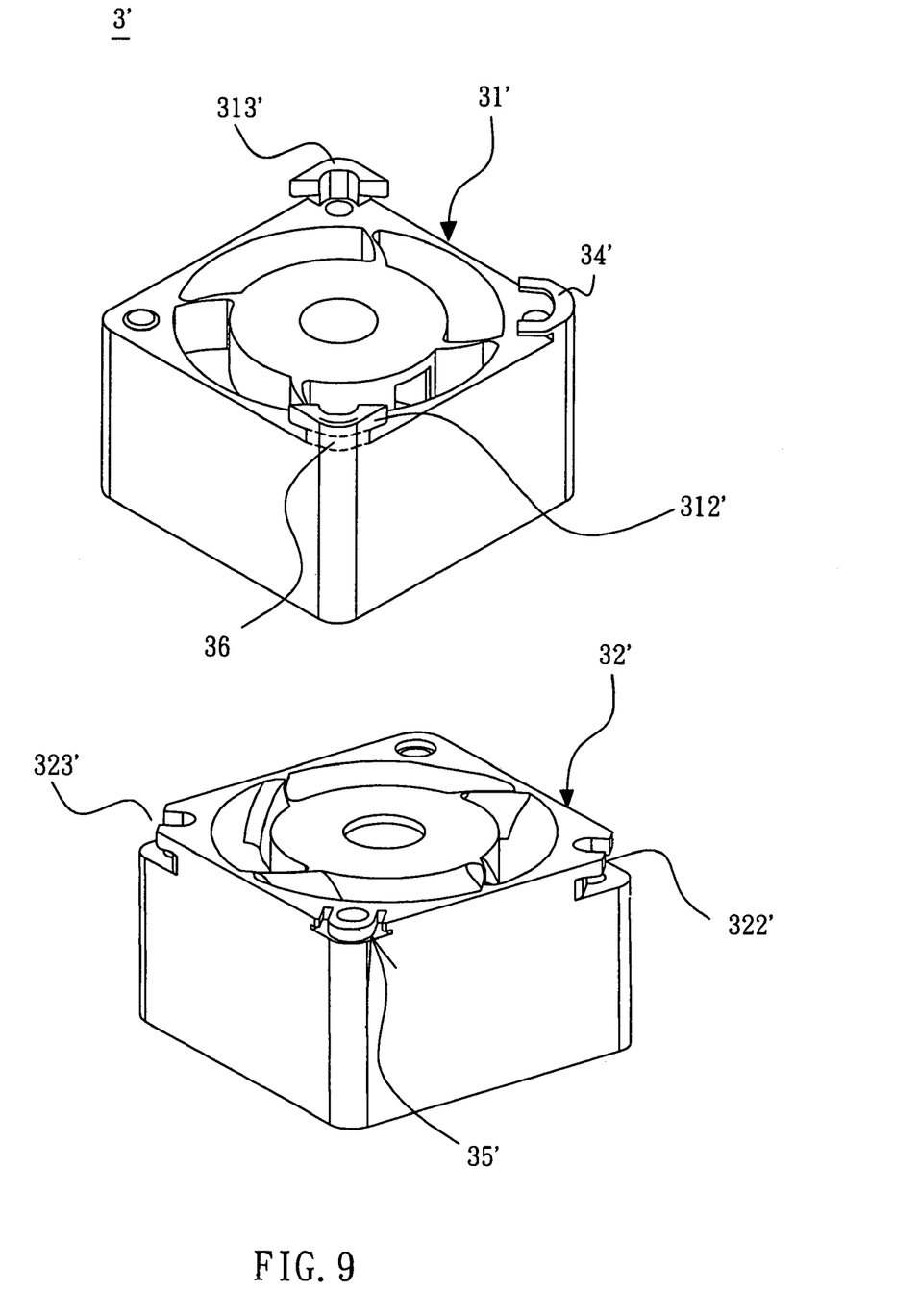
FIG. 9 is a schematic view showing the first protrusion portion, the second protrusion portion, the first recess portion and the second recess portion according to another aspect of the invention.

Referring to FIG. 9, a composite fan frame 3' includes a first frame 31' and a second frame 32'. A first protrusion portion 312' and a second protrusion portion 313' of the first frame 31' have substantially triangular shapes. Correspondingly, a first recess portion 322' and a second recess portion 323' are formed on the second frame 32' and disposed oppositely. Herein, the aspects of the first protrusion portion 312', the second protrusion portion 313', the first recess portion 322' and the second recess portion 323' are different from those of the protrusion portions and the recess portions of FIG. 7. The difference between FIG. 7 and FIG. 9 is that each of the first protrusion portion 312' and the second protrusion portion 313' has an extension post 36 for increasing the height of the protrusion portion. Correspondingly, the first recess portion 322' and the second recess portion 323' have appropriate depths for accommodating the first protrusion portion 312' and the second protrusion portion 313'. As the results, the first frame 31' and the second frame 32' can be combined together tightly.

Similar to FIG. 7, the first frame 31' of FIG. 9 may further include a stopper 34' disposed on the surface of the first frame 31', or preferably, disposed on another corner of the tetragonal shape of the first frame 31'. The stopper 34' is for controlling a relative movement of the first frame 31' and the second frame 32 so as to achieve the effect of positioning. The stopper 34' may have a U shape, a V shape or other shapes. In this embodiment, the shapes of the stopper 34', the first protrusion portion 312' and the second protrusion portion 313' are the same. Meanwhile, a slot 35' having a shape matching with the stopper 34' is also formed on the surface of the second frame 32'. Thus, when the first protrusion portion 312' and the second protrusion portion 313' are respectively inserted into the first recess portion 322' and the second recess portion 323', the frames 31' and 32' can be positioned when the stopper 34' reaches to the slot 35'. As the results, it is possible to prevent users from further applying a force, which makes the first protrusion portion 312' and the second protrusion portion 313' to move beyond the first recess portion 322' and the second recess portion 323'.

Figure 10:
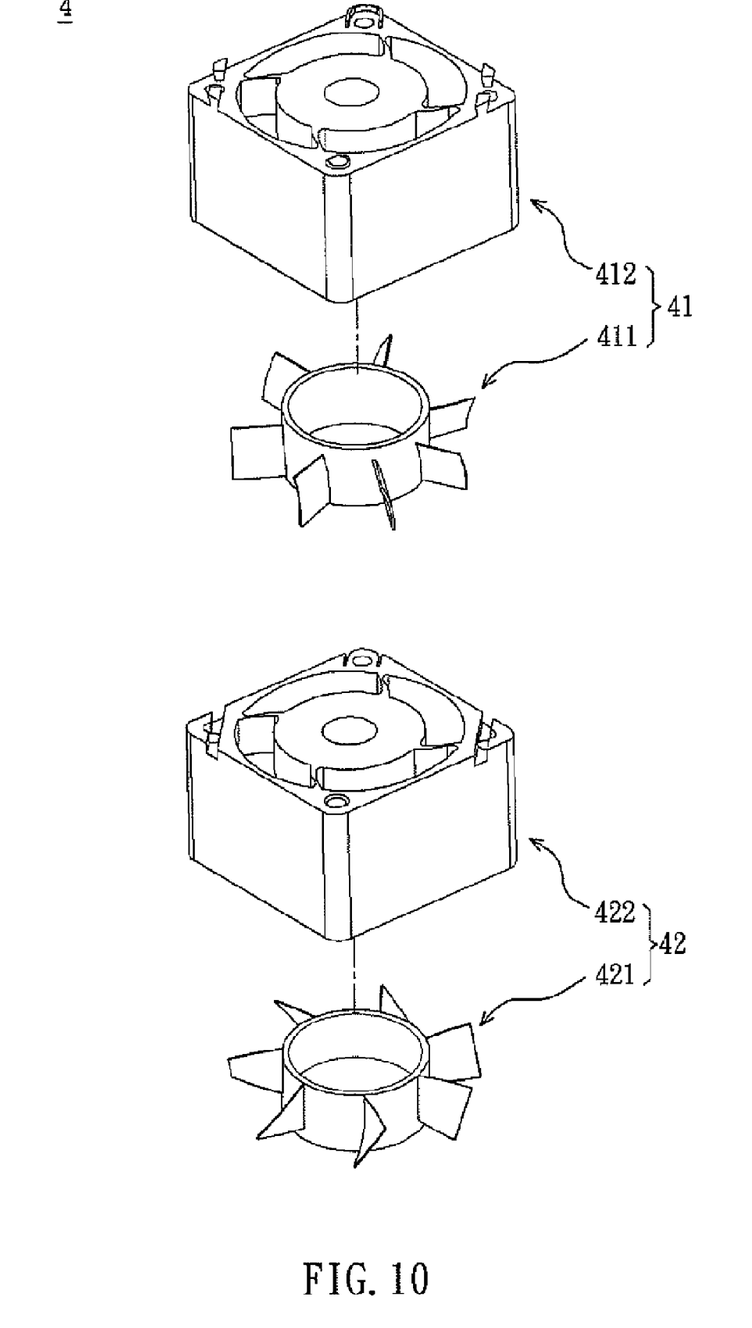
FIG. 10 is a schematic view showing a composite fan using the composite fan frame according to the first embodiment of the invention.
Figure 11:
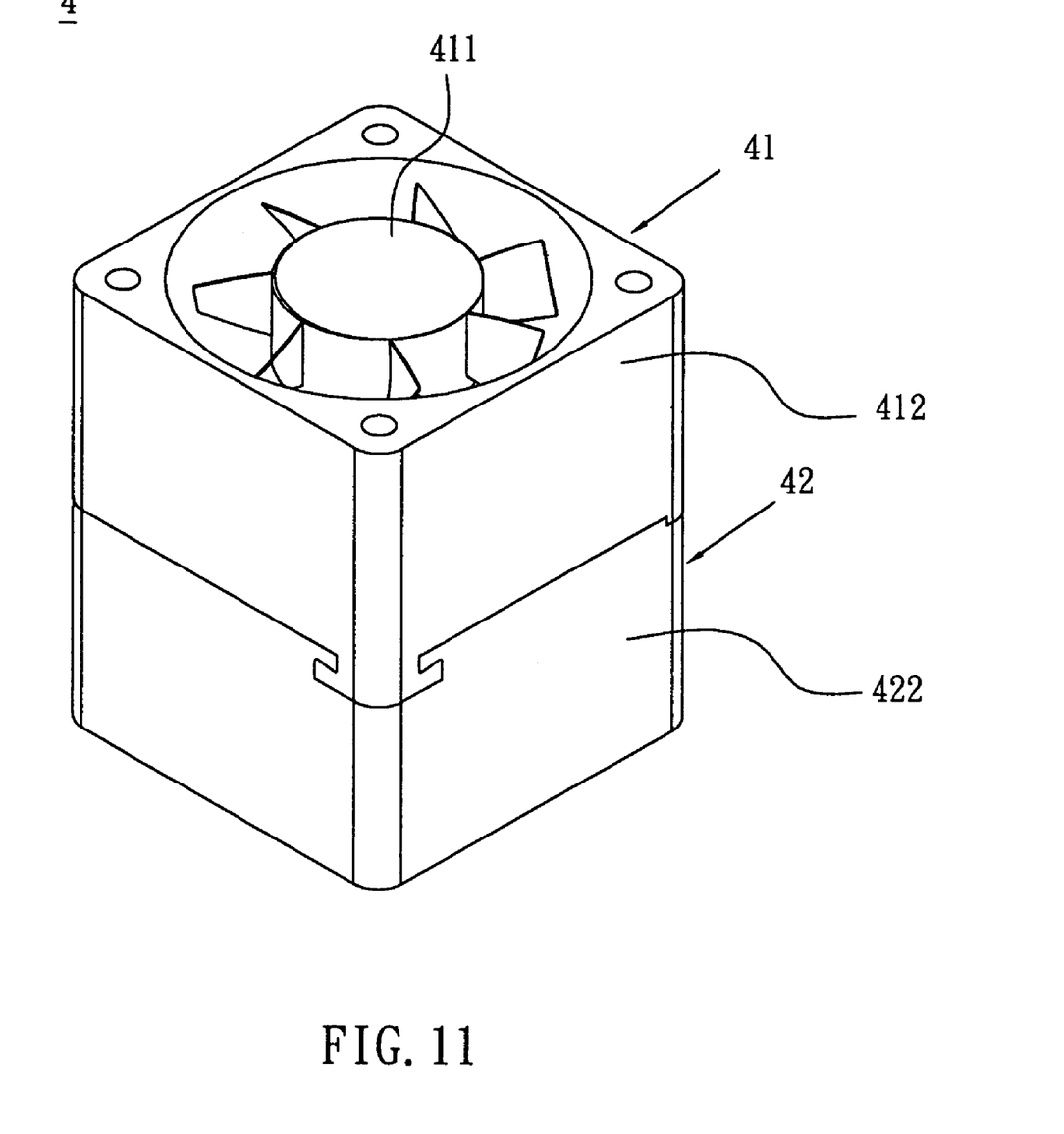
FIG. 11 is a schematic view showing the composite fan of FIG. 10 after being assembled.

For the sake of explaining convenience, only two frames are present in each of the composite frame 2, 3, or 3' of the above-mentioned embodiments. However, any one of the composite frame 2, 3 and 3' can be used to form a composite fan. Illustration will be made according to the composite fan frame 2 of the first embodiment. Please refer to FIGS. 10 and 11. FIG. 10 is the schematic view showing the composite fan 4 using the composite frame according to the first embodiment of the invention, and FIG. 11 is the schematic view showing the composite fan of FIG. 10 after being assembled.

A composite fan 4 includes a first fan 41 and a second fan 42. The first fan 41 has a first impeller 411 and a first frame 412, and the first frame 412 has a first surface formed with at least one first protrusion portion, and a first cavity for allowing the first impeller 411 to be disposed therein. The second fan 42 has a second impeller 421 and a second frame 422, and the second frame 422 has a second surface formed with at least one first recess portion, and a second cavity for allowing the second impeller 421 to be disposed therein. After the first frame 412 and the second frame 422 are combined together, the composite fan 4 is formed. Herein, the first frame 412 and the second frame 422 are same as the first frame 21, 31, 31' and the second frame 22, 32, 32' as described above. One of the first frame 412 and the second frame 422 illustrated in FIG. 10 is inversed to assemble with the other one.

As mentioned hereinabove, because the composite fan and the fan frame thereof according to the invention have the first protrusion portion, the second protrusion portion and the corresponding first recess portion and the corresponding second recess portion, the first frame and the second frame can be easily assembled. When users want to install the two fans to a system, only a single long screw is used to pass through the holes 26 (FIG. 6) of the two fans so that the frames 21 and 22 are installed to the system. Compared to the prior art, the fan and the fan frame thereof according to the invention can be easily assembled without using extra elements and can reduce the production cost and have improved structure intensity.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A composite fan frame, comprising:
   a first frame having a first surface formed with at least one first protrusion portion which is located at one of corners of the first frame; and
   a second frame having a second surface formed with at least one first recess portion which is located at one of corners of the second frame, wherein when the first surface touches the second surface, the first protrusion portion is inserted into the first recess portion along a predetermined straight-line sliding direction such that the first frame and the second frame are combined, wherein the first frame and the second frame are disposed along an axial direction, and the predetermined straight-line sliding direction is not parallel to the axial direction.

2. The composite fan frame according to claim 1, wherein the first frame or the second frame further comprises a stopper disposed on the first surface or the second surface along the predetermined straight-line sliding direction.

3. The composite fan frame according to claim 2, wherein the stopper has a U shape or V shape.

4. The composite fan frame according to claim 1, the first frame further comprises a stopper disposed on the first surface of the first frame, and a slot having a shape matching with the stopper is correspondingly formed on the second surface of the second frame.

5. The composite fan frame according to claim 1, wherein the first protrusion portion has a first inclined surface, the first recess portion has a second inclined surface, and when the first protrusion portion is inserted into the first recess portion, the first inclined surface rests against the second inclined surface.

6. The composite fan frame according to claim 1, wherein the first surface of first frame has a substantially tetragonal shape, and the first protrusion portion is disposed on one corner of the first surface.

7. The composite fan frame according to claim 1, wherein the first surface is further formed with a second protrusion portion, and the second protrusion portion and the first protrusion portion are disposed at two opposite corners of the first surface.

8. The composite fan frame according to claim 7, wherein each of the first protrusion portion and the second protrusion portion has a substantially triangular shape.

9. The composite fan frame according to claim 7, wherein each of the first protrusion portion and the second protrusion portion has elasticity and flexibility.

10. The composite fan frame according to claim 7, wherein the first protrusion portion or the second protrusion portion further comprises an extension post for increasing a height of the first protrusion portion or the second protrusion portion.

11. The composite fan frame according to claim 7, wherein the second surface further has a second recess portion, the second recess portion and the first recess portion are disposed oppositely, when the first protrusion portion is inserted into the first recess portion along the predetermined straight-line sliding direction, the second protrusion portion is inserted into the second recess portion along the predetermined straight-line sliding direction such that the first frame and the second frame are combined.

12. The composite fan frame according to claim 11, wherein each of the first protrusion portion and the second protrusion portion has a first inclined surface, and each of the first recess portion and the second recess portion has a second inclined surface.

13. The composite fan frame according to claim 11, wherein the first recess portion and the second recess portion are respectively disposed at two opposite corners of the second surface.

14. The composite fan frame according to claim 1, wherein a cross-section of the first protrusion portion is an inverse trapezoid, and a cross-section of the first recess portion is a trapezoid.

15. A composite fan, comprising:
    a first fan having a first frame and a first impeller, the first frame comprising a first surface formed with at least one first protrusion portion which is located at one of corners of the first frame, and a first cavity for allowing the first impeller to be disposed therein; and
    a second fan having a second frame and a second impeller, the second frame comprising a second surface formed with at least one first recess portion which is located at one of corners of the second frame, and a second cavity for allowing the second impeller to be disposed therein,
    wherein when the first surface touches the second surface, the first protrusion portion is inserted into the first recess portion along a predetermined straight-line sliding direction such that the first fan and the second fan are combined, wherein the first frame and the second frame are disposed along an axial direction, and the predetermined straight-line sliding direction is not parallel to an axial direction.

16. The composite fan according to claim 15, wherein the first frame or the second frame further comprises a stopper disposed on the first surface or the second surface along the predetermined straight-line sliding direction.

17. The composite fan according to claim 15, wherein the first frame further comprises a stopper is disposed on the first surface of the first frame, and a slot having a shape matching with the stopper is correspondingly formed on the second surface of the second frame.

18. The composite fan according to claim 15, wherein the first protrusion portion has a first inclined surface, the first recess portion has a second inclined surface, and when the first protrusion portion is inserted into the first recess portion, the first inclined surface rests against the second inclined surface.

19. The composite fan according to claim 15, wherein the first protrusion portion further comprises an extension post for increasing a height of the first protrusion portion.

20. The composite fan according to claim 15, wherein the first frame and the second frame are disposed back to back.

* * * * *